United States Patent
Chen et al.

(10) Patent No.: US 9,755,670 B2
(45) Date of Patent: Sep. 5, 2017

(54) ADAPTIVE LOAD FOR COUPLER IN BROADBAND MULTIMODE MULTIBAND FRONT END MODULE

(71) Applicant: SKYWORKS SOLUTIONS, INC., Woburn, MA (US)

(72) Inventors: David Ruimin Chen, Thousand Oaks, CA (US); Shiaw Wen Chang, Thousand Oaks, CA (US); Ede Peter Enobakhare, Camarillo, CA (US); Brian Blu DuVerneay, Chicago, IL (US)

(73) Assignee: SKYWORKS SOLUTIONS, INC., Woburn, MA (US)

( * ) Notice: Subject to any disclaimer, the term of this patent is extended or adjusted under 35 U.S.C. 154(b) by 0 days.

(21) Appl. No.: 15/358,233

(22) Filed: Nov. 22, 2016

(65) Prior Publication Data
US 2017/0077966 A1   Mar. 16, 2017

(51) Int. Cl.
| | |
|---|---|
| H04B 1/04 | (2006.01) |
| H01P 1/213 | (2006.01) |
| H03H 7/38 | (2006.01) |
| H04L 25/02 | (2006.01) |
| H04W 88/06 | (2009.01) |

(52) U.S. Cl.
CPC ............. H04B 1/04 (2013.01); H01P 1/213 (2013.01); H03H 7/38 (2013.01); H04L 25/0278 (2013.01); H04W 88/06 (2013.01)

(58) Field of Classification Search
CPC ............. H01P 1/213; H03H 7/38; H04B 1/04
See application file for complete search history.

(56) References Cited

U.S. PATENT DOCUMENTS

| | | |
|---|---|---|
| 3,611,199 A | 10/1971 | Safran |
| 3,868,594 A | 2/1975 | Cornwell et al. |
| 4,460,875 A | 7/1984 | Harman |
| 4,677,399 A | 6/1987 | Le Dain et al. |
| 4,764,740 A | 8/1988 | Meyer |
| 5,038,112 A | 8/1991 | O'Neill |
| 5,222,246 A | 6/1993 | Wolkstein |
| 5,276,411 A | 1/1994 | Woodin, Jr. et al. |
| 5,363,071 A | 11/1994 | Schwent et al. |

(Continued)

FOREIGN PATENT DOCUMENTS

| | | |
|---|---|---|
| EP | 2503701 A2 | 9/2012 |
| JP | 2001127664 A | 5/2001 |

(Continued)

*Primary Examiner* — Tuan Pham
(74) *Attorney, Agent, or Firm* — Lando & Anastasi, LLP

(57) ABSTRACT

Directional couplers for front end modules (FEMs) are disclosed that include a first port configured to receive a radio-frequency (RF) signal, a second port connected to the first port via a first transmission line and configured to provide an RF output signal, a third port connected to a second transmission line, the second transmission line being electromagnetically coupled to the first transmission line, and a fourth port connected to the second transmission line. The directional couplers further include an adaptive complex termination circuit connected to the fourth port and configured to provide an adaptive complex termination impedance selected to optimize combined performance of the directional couplers over multiple frequency bands.

19 Claims, 10 Drawing Sheets

(56) References Cited

U.S. PATENT DOCUMENTS

| | | |
|---|---|---|
| 5,487,184 A | 1/1996 | Nagode |
| 5,745,016 A | 4/1998 | Salminen |
| 6,020,795 A | 2/2000 | Kim |
| 6,078,299 A | 6/2000 | Scharfe, Jr. |
| 6,108,527 A | 8/2000 | Urban et al. |
| 6,329,880 B2 | 12/2001 | Akiya |
| 6,496,708 B1 | 12/2002 | Chan et al. |
| 6,771,141 B2 | 8/2004 | Iida et al. |
| 6,972,640 B2 | 12/2005 | Nagamori et al. |
| 7,042,309 B2 | 5/2006 | Podell |
| 7,305,223 B2 | 12/2007 | Liu et al. |
| 7,319,370 B2 | 1/2008 | Napijalo |
| 7,336,142 B2 | 2/2008 | Vogel |
| 7,493,093 B2 | 2/2009 | Boerman et al. |
| 7,538,635 B2 | 5/2009 | Fukuda et al. |
| 7,546,089 B2 | 6/2009 | Bellantoni |
| 8,175,554 B2 * | 5/2012 | Camuffo .............. H03G 3/3042 455/126 |
| 8,248,302 B2 | 8/2012 | Tsai et al. |
| 8,289,102 B2 | 10/2012 | Yamamoto et al. |
| 8,315,576 B2 | 11/2012 | Jones |
| 8,417,196 B2 | 4/2013 | Kitching et al. |
| 8,606,198 B1 * | 12/2013 | Wright ..................... H01P 5/18 333/109 |
| 9,014,647 B2 | 4/2015 | Kitching et al. |
| 9,214,967 B2 | 12/2015 | Reisner et al. |
| 9,356,330 B1 | 5/2016 | Donoghue et al. |
| 2002/0113666 A1 | 8/2002 | Yamazaki et al. |
| 2002/0139975 A1 | 10/2002 | Lewis et al. |
| 2004/0127178 A1 | 7/2004 | Kuffner |
| 2005/0040912 A1 | 2/2005 | Pelz |
| 2005/0146394 A1 | 7/2005 | Podell |
| 2005/0170794 A1 | 8/2005 | Koukkari et al. |
| 2006/0232359 A1 | 10/2006 | Fukuda et al. |
| 2007/0159268 A1 | 7/2007 | Podell |
| 2008/0070519 A1 | 3/2008 | Okabe |
| 2008/0112466 A1 | 5/2008 | Sasaki |
| 2009/0134953 A1 | 5/2009 | Hunt et al. |
| 2009/0278624 A1 | 11/2009 | Tsai et al. |
| 2011/0057746 A1 | 3/2011 | Yamamoto et al. |
| 2011/0063044 A1 * | 3/2011 | Jones ..................... H01P 5/184 333/109 |
| 2011/0199166 A1 | 8/2011 | Carrillo-Ramirez |
| 2011/0279192 A1 | 11/2011 | Nash et al. |
| 2011/0298559 A1 | 12/2011 | Kitching et al. |
| 2012/0019332 A1 | 1/2012 | Hino et al. |
| 2012/0243579 A1 | 9/2012 | Premakanthan et al. |
| 2013/0005284 A1 | 1/2013 | Dalipi |
| 2013/0113575 A1 | 5/2013 | Easter |
| 2013/0194054 A1 | 8/2013 | Presti |
| 2013/0207741 A1 | 8/2013 | Presti |
| 2013/0293316 A1 * | 11/2013 | Kitching .................. H03F 3/72 333/17.3 |
| 2013/0307635 A1 | 11/2013 | Kase et al. |
| 2014/0266499 A1 | 9/2014 | Noe |
| 2014/0368293 A1 | 12/2014 | Mukaiyama |
| 2015/0002239 A1 | 1/2015 | Tanaka |
| 2015/0200437 A1 | 7/2015 | Solomko et al. |
| 2015/0349742 A1 | 12/2015 | Chen et al. |
| 2016/0028147 A1 | 1/2016 | Srirattana et al. |
| 2016/0028420 A1 | 1/2016 | Srirattana et al. |
| 2016/0043458 A1 | 2/2016 | Sun et al. |
| 2016/0065167 A1 | 3/2016 | Granger-Jones et al. |
| 2016/0079649 A1 | 3/2016 | Ilkov et al. |
| 2016/0079650 A1 | 3/2016 | Solomko et al. |
| 2016/0172737 A1 | 6/2016 | Srirattana et al. |
| 2016/0172738 A1 | 6/2016 | Srirattana et al. |
| 2016/0172739 A1 | 6/2016 | Srirattana et al. |
| 2016/0172740 A1 | 6/2016 | Srirattana et al. |

FOREIGN PATENT DOCUMENTS

| | | |
|---|---|---|
| JP | 2013126067 A | 6/2013 |
| KR | 20040037465 A | 5/2004 |
| KR | 20110118289 A | 10/2011 |

* cited by examiner

ADAPTIVE LOAD FOR COUPLER IN BROADBAND MULTIMODE MULTIBAND FRONT END MODULE

CROSS-REFERENCE TO RELATED APPLICATIONS

This application is a continuation-in-part of, and claims priority under 35 U.S.C. §120 to, co-pending U.S. application Ser. No. 14/723,886 filed on May 28, 2015, which claims priority to U.S. Provisional Application No. 62/004,325 filed on May 29, 2014 and titled ADAPTIVE LOAD FOR COUPLER IN BROADBAND MULTIMODE MULTI-BAND FRONT END MODULE, each of which is hereby incorporated by reference herein in its entirety.

BACKGROUND

Directional couplers can be used in connection with front end modules (FEMs) in certain radio frequency (RF) devices. Output power control accuracy in front end modules can be adversely affected by various design and/or operational factors.

SUMMARY OF THE INVENTION

Aspects and embodiments generally relate to front end modules in radio-frequency (RF) devices. In some implementations, certain aspects relate to directional couplers for use with front end modules in RF devices.

According to one embodiment a daisy-chain directional coupler system comprises a first directional coupler including a first input port configured to receive a first RF signal within a first frequency band, the first directional coupler further including a first output port connected to the first input port via a first main transmission line and configured to provide the first RF signal, a first coupled port, and a first isolated port connected to the first coupled port via a first coupled transmission line, the first coupled transmission line being electromagnetically coupled to the first main transmission line, and a second directional coupler including a second input port configured to receive a second RF signal within a second frequency band different from the first frequency band, the second directional coupler further including a second output port connected to the second input port via a second main transmission line and configured to provide the second RF signal, a second coupled port connected to the first isolated port, and a second isolated port connected to the second coupled port via a second coupled transmission line, the second coupled transmission line being electromagnetically coupled to the second main transmission line. The daisy-chain directional coupler system further comprises a termination circuit connected to the second isolated port and configured to provide a shared termination impedance for the first and second directional couplers selected to optimize combined performance of the first and second directional couplers over the first and second frequency bands, the shared termination impedance being a complex impedance.

According to one embodiment a daisy-chain directional coupler system comprises a first directional coupler including a first input port configured to receive a RF signal within a first frequency band, a first output port, a first coupled port, and a first isolated port, a second directional coupler including a second input port configured to receive a second RF signal within a second frequency band different from the first frequency band, a second output port, a second coupled port connected to the first isolated port, and a second isolated port, and a termination circuit connected to the second isolated port and configured to provide a shared termination impedance for the first and second directional couplers selected to optimize combined performance of the first and second directional couplers over the first and second frequency bands, the shared termination impedance being a complex impedance.

In certain embodiments, the termination circuit includes first and second passive devices that are configured to resonate at a frequency within the first frequency band. The first passive device may be a resistor and the second passive device may be a capacitor. In certain embodiments, the first passive device may be a resistor and the second passive device may be an inductor.

In certain embodiments, the termination circuit further includes a third passive device in parallel with the first and second passive devices. The first passive device may be a resistor, one of the second and third passive devices may be a capacitor and another of the second and third passive devices may be an inductor. In certain embodiments, the termination circuit includes a diplexer for selectively connecting the second transmission line to the first or second impedance. In certain embodiments the termination circuit includes a first inductor, a first capacitor, and a resistor connected in series with one another. The termination circuit may further include a second capacitor connected in parallel with the resistor. The termination circuit further includes a second inductor connected in parallel with the resistor and the second capacitor.

Certain embodiments provide an RF system including a first directional coupler having a first input port, a first output port, a first coupled port, and a first isolated port, the first directional coupler configured to receive a first RF signal within a first frequency band at the first input port and to provide the first RF signal on the first output port, and a second directional coupler having a second input port, a second output port, a second coupled port, and a second isolated port, the second directional coupler configured to receive a second RF signal at the second input port and to provide the second RF signal at the second output port, the second RF signal being within a second frequency band different from the first frequency band, the second coupled port being connected to the first isolated port. The RF system further includes a power amplifier module connected to the first input port of the first directional coupler and to the second input port of the second directional coupler and configured to provide the first and second RF signals, power detection circuitry connected to the first coupled port of the first directional coupler, and a termination circuit connected to the second isolated port of the second directional coupler and configured to provide a shared termination impedance for the first and second directional couplers selected to optimize combined performance of the first and second directional couplers over the first and second frequency bands, the shared termination impedance being a complex impedance.

The termination circuit may include first and second passive devices are configured to resonate at a frequency within the first frequency band. The first passive device may be an inductor and the second passive device may be a capacitor. In certain embodiments, the termination circuit further includes a third passive device in parallel with the first and second passive devices. In certain embodiments, one of the first and second passive devices is a capacitor and another of the first and second passive devices is an inductor and the third passive devices is a resistor. In certain embodiments the termination circuit includes a first inductor, a first capacitor, and a resistor connected in series with one another. The termination circuit may further include a second capacitor connected in parallel with the resistor. The termination circuit may further include a second inductor connected in parallel with the resistor and the second capacitor.

The termination circuit may include a diplexer for selectively connecting the second transmission line to the first or second impedance.

Certain embodiments provide a wireless device including a transceiver configured to process a plurality of RF signals in a corresponding plurality of frequency bands, an antenna in communication with the transceiver configured to transmit the plurality of RF signals, and a plurality of directional couplers each having an input port configured to receive one of the RF signals in a respective one of the plurality of frequency bands and an output port configured to provide the one of the RF signals to the antenna, the plurality of directional couplers each further including a main transmission line extending between the input port and the output port and a coupled transmission line, the coupled transmission lines of the plurality of directional couplers being connected together in series to provide a daisy-chain of the plurality of directional couplers. The wireless device further includes a power amplifier module connected to the input port of each directional coupler in the daisy-chain and configured to provide the plurality of RF signals, power detection circuitry connected to a coupled port of a first directional coupler in the daisy-chain, and a termination circuit connected to an isolated port of a last directional coupler in the daisy-chain and configured to provide a shared termination impedance for the plurality of directional couplers that is selected to optimize combined performance of the plurality of directional couplers over the plurality of frequency bands.

The termination circuit may include first and second passive devices that are configured to resonate at a frequency within at least one of the plurality of frequency bands. For example, the first passive device may be a capacitor and the second passive device may be an inductor. In certain embodiments, the termination circuit further includes a third passive device in parallel with the first and second passive devices. In certain embodiments the termination circuit includes a first inductor, a first capacitor, and a resistor connected in series with one another. The termination circuit may further include a second capacitor connected in parallel with the resistor. The termination circuit may further include a second inductor connected in parallel with the resistor and the second capacitor.

Certain embodiments provide a process for operating a directional coupler, the process including receiving an RF signal on a first port of the directional coupler, providing at least a first portion of the RF signal to a second port of the directional coupler connected to the first port via a first transmission line, and coupling at least a second portion of the RF signal to a second transmission line, the second transmission line connecting between third and fourth ports of the directional coupler. The process may further involve providing a termination circuit connected to the second transmission line at either the third or fourth port and configured to provide a complex impedance configured to be self-adjusting with changing frequency of the RF signal so as to optimize performance of the directional coupler over multiple frequency bands.

BRIEF DESCRIPTION OF THE DRAWINGS

Various embodiments are depicted in the accompanying drawings for illustrative purposes, and should in no way be interpreted as limiting the scope of the invention(s). In addition, various features of different disclosed embodiments can be combined to form additional embodiments, which are part of this disclosure. Throughout the drawings, reference numbers may be reused to indicate correspondence between referenced elements.

DETAILED DESCRIPTION

Figure 1:
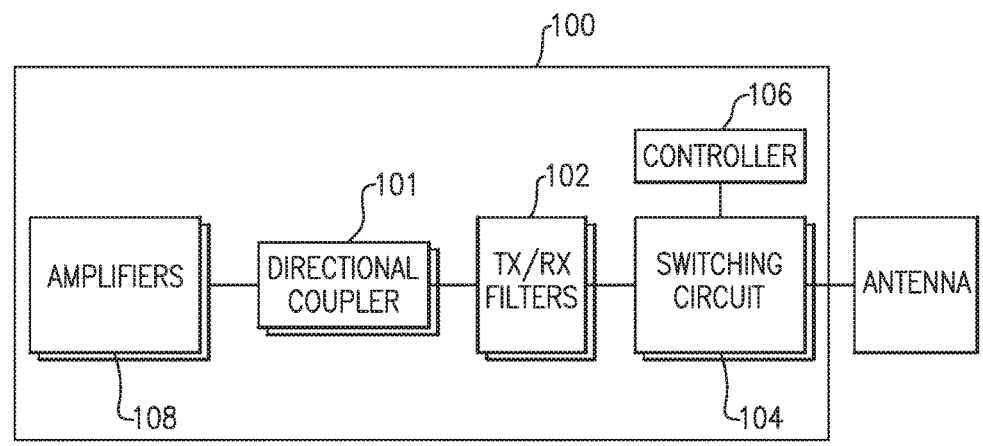
FIG. 1 is a block diagram of a front-end module (FEM) for an RF device according to one or more embodiments.

Disclosed herein are examples of configurations and embodiments relating to adaptive loads for directional couplers in front end modules.

The demand and usage associated with mobile internet and multimedia services has expanded significantly in recent years. Mobile web browsing, music and video downloading/streaming, video teleconferencing, social networking, gaming, broadcast television, and other mobile services are examples of common mobile internet usages. To accommodate such mobile connectivity applications, various advanced mobile devices have been developed, including smart phones, personal digital assistants (PDAs), netbooks, tablet personal computers (PC)s and data cards, and others.

Mobile devices may be configured to support various wireless standards, including, for example, 3G WCDMA/HSPA and 4G LTE standards, and may also be configured to support backward compatibility with the legacy 2G GSM and 2.5G GPRS/EDGE standards. Furthermore, such devices may support a plurality of frequency bands, and may be required to do so while maintaining relatively low cost and/or size. Increased complexity of mobile devices can result in more stringent requirements with respect to the design of components for front end modules (FEMs), such as filters, switches and/or power amplifier modules (PAMs). For example, certain PAMs in handsets and other mobile devices are designed to accommodate a quad-band GSM/GPRS/EDGE PAM plus one or more single-mode, single-band 3G PAMs. In certain embodiments, a front end module or power amplifier module may be configured to support all relevant air interface standards while covering all relevant frequency bands.

Power control requirements of various communications systems, such as WCDMA, GSM/EDGE, and/or other types of systems, can introduce challenges in the design of the power amplifiers or front end modules. For example, although output power control accuracy is often a clearly-defined design specification, the interaction of control bandwidth, switching spectrum and mismatched load are often not fully investigated until late in the product development cycle; such concerns are often among the last few design specifications worked out near the end of a design cycle. State-of-the-art multimode and multiband handset front end modules may require dynamic range over 40 dB, with, for example, +/−0.5 dB power control accuracy at a mismatched load. To achieve such accurate power control, it may be necessary to be able to measure the signal power very accurately. As discussed further below, directional couplers are often used in front end modules to couple off a portion of the signal power and provide it to a detector for measurement. The measurement can be used in a feedback loop for power control. In order to provide accurate power measurement, very good coupler performance, optionally over multiple operating frequency bands, may be required. Accordingly, it may be desirable to provide a directional coupler having good and well-defined directivity and coupling factor, as well as minimal detector/coupler error, over a wide operating frequency band or multiple operating frequency bands.

Front end modules designed to provide multiband multimode functionality may comprise various components designed to accommodate such functionality. FIG. 1 provides an illustration of an embodiment of a front-end module (FEM) 100 for an RF device (such as a wireless device), which may implement one or more features described herein. The front end module 100 may be a multimode, multiband (MMMB) front end module. The front end module 100 may include an assembly 102 of transmitting (TX) and/or receiving (RX) filters. The front end module 100 can also include one or more switching circuits 104. In some embodiments, control of the switching circuit(s) 104 can be performed or facilitated by a controller 106. The front end module 100 can be configured to be in communication with an antenna, or with a plurality of antennas. In some implementations, the front end module 100 can be included in an RF device such as a wireless device. The front end module can be implemented directly in the wireless device, in one or more modular forms as described herein, or in some combination thereof. In some embodiments, such a wireless device can include, for example, a cellular phone, a smartphone, a hand-held wireless device with or without phone functionality, a wireless tablet, a wireless router, a wireless access point, a wireless base station, a wearable wireless computing device, etc.

The front end module 100 includes one or more amplifiers 108 or amplifier modules coupled to one or more directional couplers 101. Directional couplers may be used in RF power amplifier applications for coupling a certain amount of the transmission power in a transmission line out through another port. In the case of microstrip or stripline couplers, for example, such coupling is achieved by using two transmission lines set close enough together such that energy passing through one is coupled to the other. Generally speaking, power coupling and control architectures for handsets can be broken down into two primary groups: direct and indirect detection. Indirect power detection measures DC characteristics without directly evaluating the RF output power. Relatively simple circuitry associated with indirect detection can offer a lower cost and/or smaller size solution. However, in certain embodiments, indirect detection systems can suffer from control accuracy issues due to unpredictable antenna loading conditions. In contrast, direct power detection monitors the RF waveform itself, and often requires a directional coupler and associated design complexity. Couplers can be implemented with discrete components or integrated in a printed circuit board.

As discussed above, in modern communications devices, multiple amplifiers 108 can be included and configured to operate over multiple different frequency bands in order to support multiple different communications standards or protocols. Further, due to restrictions on the size, and therefore on resulting circuit board space, of certain devices (such as mobile phones or similar devices), it may be necessary or desirable that multiple power amplifiers 108 share a common directional coupler 101. As a result, there may be a need for the directional coupler 101 to provide accurate power measurement over multiple frequency bands. Conventionally, when a single directional coupler operates with a single power amplifier in a single frequency band, the design of the directional coupler can be optimized, such that high performance is achieved in the frequency band of interest. However, achieving adequate performance of a directional coupler over multiple frequency bands can be challenging, if not impossible, using conventional approaches. This is at least in part because several characteristics of a directional coupler, such as directivity and coupling factor, are frequency-dependent, and therefore change and can reduce optimization and performance as the frequency band of operation changes. Aspects and embodiments are directed to providing a directional coupler with built-in frequency adaptability, such that high performance and reduced coupler error can be achieved over multiple frequency bands, as discussed in further detail below.

It is to be appreciated that embodiments of the methods, devices, and systems discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. Accordingly, unless the context clearly requires otherwise, throughout the description and the claims, these and similar words are to be construed in an inclusive sense, as opposed to an exclusive or exhaustive sense; that is to say, in the sense of "including, but not limited to." The word "coupled," as generally used herein, refers to two or more elements that may be either directly connected, or connected by way of one or more intermediate elements. References to "or" may be construed as inclusive so that any terms described using "or" may indicate any of a single one, more than one, and all of the described terms.

Figure 2A:
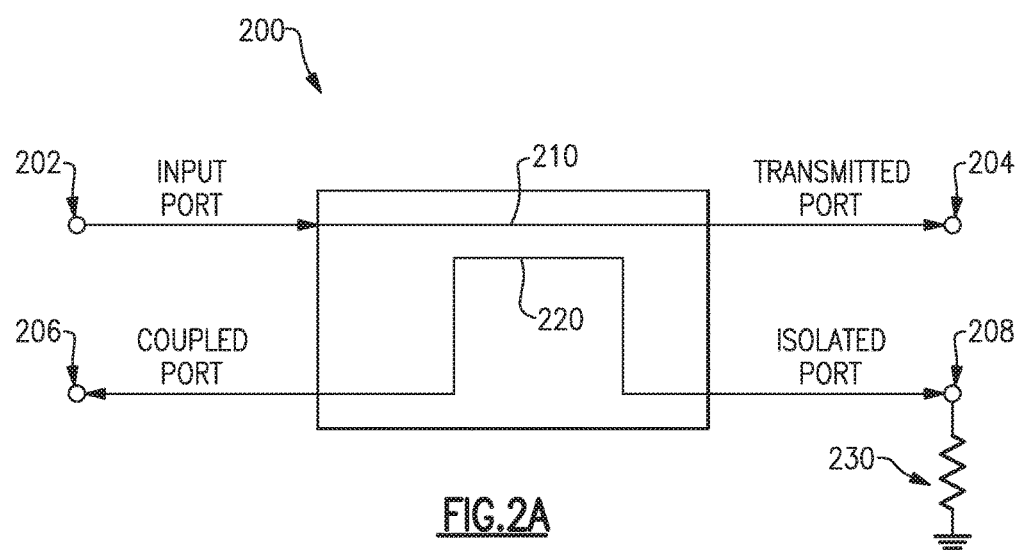
FIG. 2A is a block diagram of a directional coupler according to one or more embodiments.

Referring to FIG. 2A, a directional coupler 200 may include four ports, namely an input port 202, a transmitted port 204, a coupled port 206, and an isolation port 208. The term "main line," as used herein, may refer to the transmission line section 210 of the coupler that extends between and connects the input and transmitted ports. The term "coupled line," as used herein, may refer to the transmission line section 220 of the coupler that extends between and connects the coupled and isolation ports, and which is disposed proximate the main transmission line such that electromagnetic signal coupling can occur between the main and coupled lines, as discussed above.

Although the various ports are illustrated in a particular configuration in FIG. 2A, directional coupler ports may take on other configurations while still providing coupling functionality. That is, the various notations of FIG. 2A may be considered arbitrary in certain applications. For example, any given port may be considered the input port, wherein the directly connected port becomes the transmitted port, the adjacent port becomes the coupled port, and the diagonal port becomes the isolation port (e.g., for stripline and/or microstrip couplers).

Figure 2B:
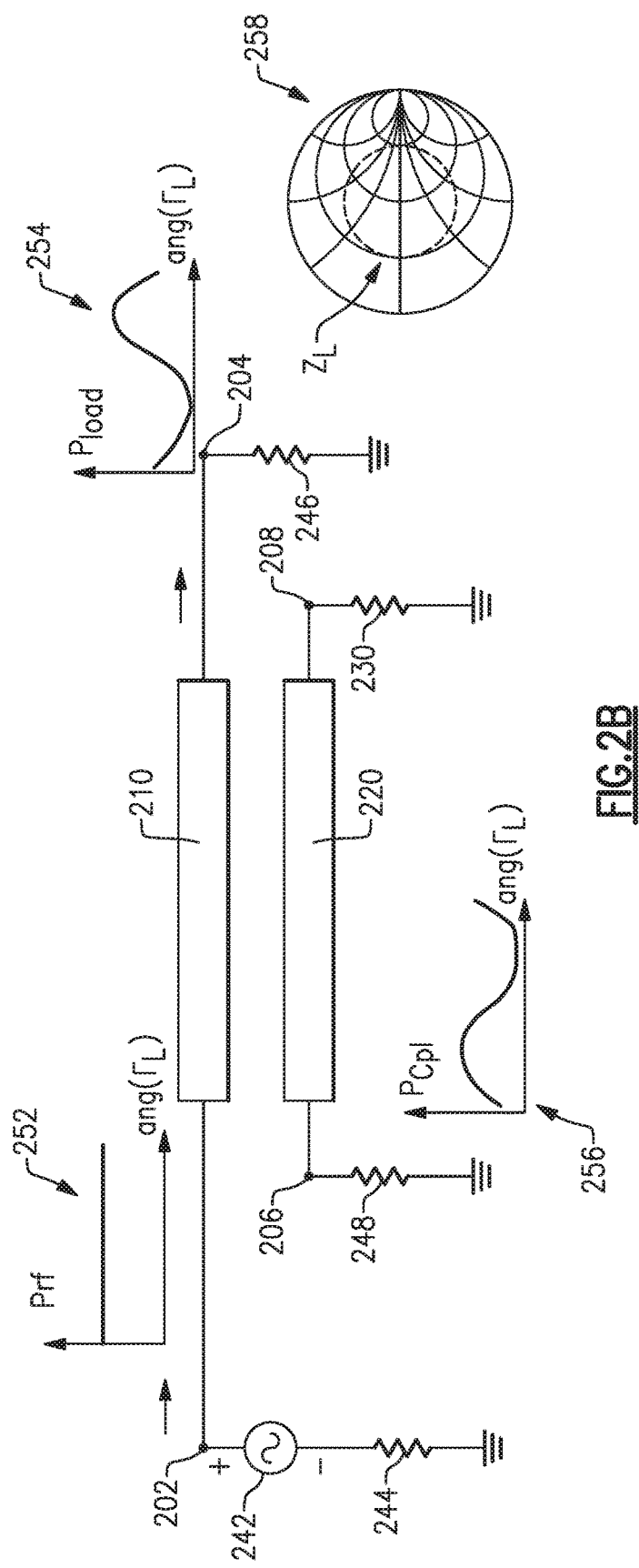
FIG. 2B is a functional schematic diagram illustrating operation of the directional coupler of FIG. 2A.

Referring to FIGS. 2A and 2B, an input RF signal 252 may be supplied at the input port 202 of the coupler 200 from an RF generator of some kind. In FIG. 2B, the RF generator is represented by a voltage source 242 grounded via a resistor 244; however in practice, the RF generator may be a transceiver, amplifier, or other component of a front end module. For example, the input signal 252 may be driven at least in part by one or more power amplifiers 108 coupled to the input port 202. The majority of this input signal 252 may be passed via the main line 210 of the coupler 200 to provide an output signal 254 to a signal recipient coupled to the transmitted port 204. A portion of the signal referred to as the coupled signal 256, for example 1% of the input signal 252 for a 20 dB coupler, may be supplied via the coupled line 220 to a detector coupled to the coupled port 206. The devices acting as the RF generator, signal transmitter, signal recipient, and detector, and configurations thereof, may depend on the system in which the coupler 200 is used. For example, the RF generator that supplies the input signal to the input port 202 may be a power amplifier, a switch, a transceiver, or any other device from which it may be desirable to take a sample (e.g., at the coupled port 206) of its output signal. The transmitted signal 254 may be received by, for example, a switch, another power amplifier, an antenna, a filter, and/or the like. In FIG. 2B, the signal recipient is represented by a load 246 having a characteristic impedance $Z_L$ (shown at 258), indicating matched load (e.g., a 50 Ohm load) at the transmitted port 204. By providing a sample of the RF input signal 252 at the coupled port 206, the coupler 200 may provide a mechanism for measuring the RF input signal. The coupled port 206 may be connected to any desirable type of detector, such as, for example, a sensor or feedback controller configured to use the coupled signal 256 to provide information to the system and/or to adjust/control the input signal.

In FIG. 2B, the input signal 252, the output signal 254, and the coupled signal 256 are represented by graphs of signal power as a function of the angular reflection coefficient of the load ($\Gamma_L$).

The isolation port 208 of the directional coupler 200 may be terminated with an internal or external matched load 230, such as a fixed real 50 Ohm or 75 Ohm load, for example.

However, terminating the coupler isolation port 208 with a fixed real load may not provide ideal coupler performance when the transmitted port 204 is not ideal and/or the coupler directivity is finite, as explained further below. In addition, while a directional coupler can be optimized (e.g., in terms of coupling factor and directivity, for example) for a single frequency band using a fixed real termination load 230 (such as a 50 Ohm load, for example), performance may be degraded when the coupler 200 is operated outside of that single frequency band. Accordingly, as discussed further below, certain embodiments provide complex (i.e., having reactive as well as resistive components) impedance termination circuitry that is self-adjusting with frequency to provide desirable coupler performance over multiple frequency bands.

The four-port directional coupler system shown in FIG. 2B may be represented by the following equation, which illustrates a general 4-port scattering matrix:

$$\begin{pmatrix} b_1 \\ b_2 \\ b_3 \\ b_4 \end{pmatrix} = \begin{pmatrix} S11 & S12 & S13 & S14 \\ S21 & S22 & S23 & S24 \\ S31 & S32 & S33 & S34 \\ S41 & S42 & S43 & S44 \end{pmatrix} * \begin{pmatrix} a_1 \\ a_2 \\ a_3 \\ a_4 \end{pmatrix} \quad (1)$$

In Equation (1), the input 202 is Port 1, the transmitted port 204 is port 2, the coupled port 206 is Port 3, and the isolation port 208 is Port 4. In Equation (1), $b_1$ represents the forward voltage wave at the input port 202, $b_2$ represents the forward voltage wave at the output port 204, $b_3$ represents the forward voltage wave at the coupled port 206, and $b_4$ represents the forward voltage wave at the isolation port 208. In certain front end module embodiments, the coupled port 206 may be matched to a 50-ohm coupling termination, represented in FIG. 2B by a resistor 248, such that $a_3$ may be considered equal to zero for simplicity. Therefore, the matrix of Equation (1) can be simplified as follows:

$$\begin{pmatrix} b_1 \\ b_2 \\ b_3 \\ b_4 \end{pmatrix} = \begin{pmatrix} S11 & S12 & S13 & S14 \\ S21 & S22 & S23 & S24 \\ S31 & S32 & S33 & S34 \\ S41 & S42 & S43 & S44 \end{pmatrix} * \begin{pmatrix} a_1 \\ a_2 \\ 0 \\ a_4 \end{pmatrix} \quad (2)$$

When the load 246 changes, the system may adjust $a_1$ to maintain $b_3$, which may be referenced to a $b_3$ value measured with a 50 ohm load (i.e., $\Gamma_L=0$).

The peak signal power of the output signal 254 at the load 246 ($P_{Lpk}$) is given by:

$$P_{Lpk} = 20\log\left[\frac{1 + |\Gamma_L S33|}{1 - |\Gamma_L S33|}\right] \quad (3)$$

The peak signal power of the coupled signal 256 ($P_{Cpk}$) at the coupled port 206 is given by:

$$P_{Cpk} = 20\log\left[\left(1 + \left|\frac{\Gamma_L S31/D}{1 - \Gamma_L S33}\right|\right) \Big/ 1 - \left|\frac{\Gamma_L S31/D}{1 - \Gamma_L S33}\right|\right] \quad (4)$$

In Equations (3) and (4), D is the directivity of the coupler 200, which can be defined by the following equation:

$$D = \frac{S31}{S32} \quad (5)$$

The scattering matrix of Equation (2) may be simplified as follows:

$$\frac{b_2}{b_3} \cong \frac{S21}{S31 - \left(S31*S22 - S32*S21 - \frac{S34*S42*S21*\Gamma_{CT}}{1-S44*\Gamma_{CT}}\right)\Gamma_L} \quad (6)$$

In Equation (6), $\Gamma_{CT}$ is the reflection coefficient of the coupler termination load 230. $\Gamma_{CT}$ is zero for a 50 Ohm load 230. If the $\Gamma_L$ coefficient (i.e., the quantity in parentheses in Equation (6)) is approximated to zero, corresponding to a matched 50 Ohm load at the transmitted port 204, and as shown in Equation (7) below, then $b_2$ may not be affected by load variations.

$$S31*S22 - S32*S21 - \frac{S34*S42*S21*\Gamma_{CT}}{1-S44*\Gamma_{CT}} = 0 \quad (7)$$

Thus:

$$\Gamma_{CT} = \quad (8)$$
$$\frac{S22 - S21/D}{S44(S22 - S21/D) + S34*S42*S21/S31} \cong \frac{S22 - S21/D}{S34*S42*S21/S31}$$

The significance of Equation (8) is that the coupler termination load 230 can be employed to offset non-ideal factors (such as non-ideal S22 and finite directivity D). Accordingly, a simple, fixed 50 Ohm or 75 Ohm resistance may not always be an ideal choice for the coupler termination load 230. Rather, certain embodiments provide complex impedance termination circuitry for the isolation port 208 that can be tuned to account for various non-ideal factors or parameters in the coupler 200. In addition, the termination circuitry may have frequency-dependent characteristics, such that it can be self-adjusting to provide different load impedance for different frequency bands of operation, thereby further improving coupler performance.

Figure 3:
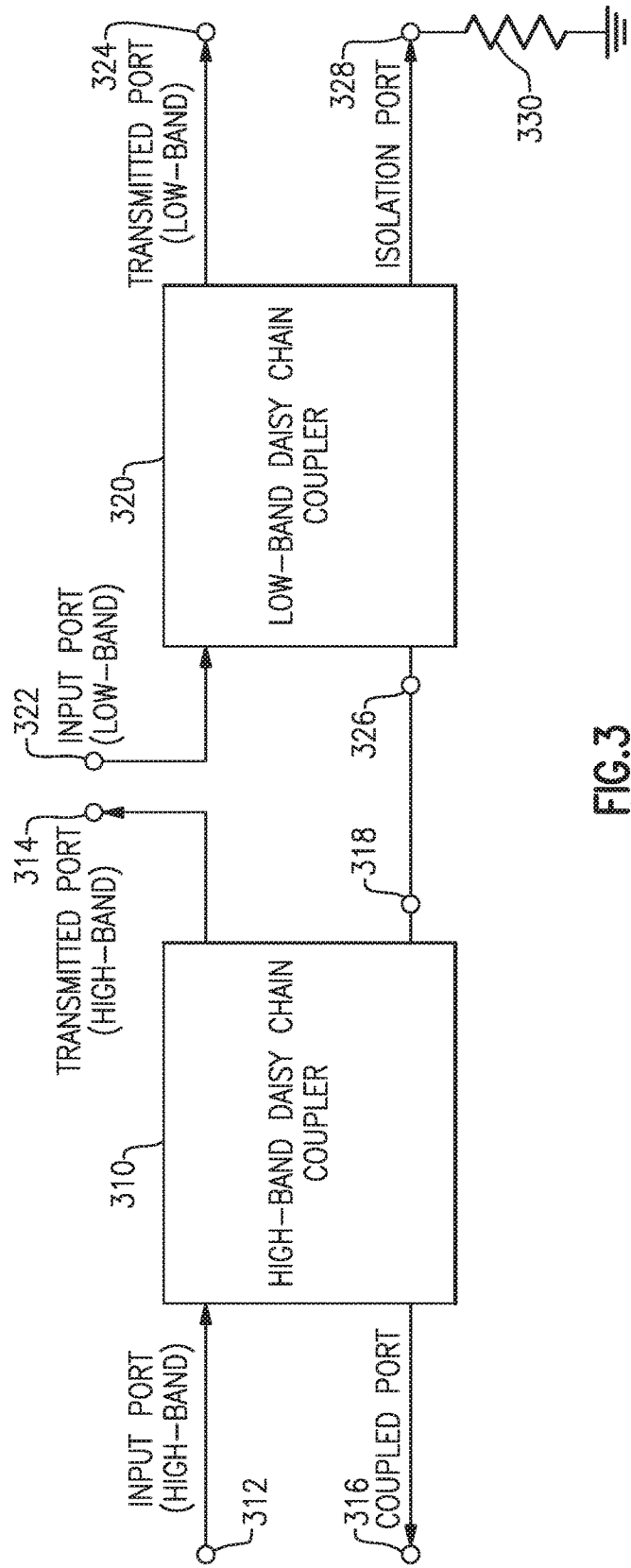
FIG. 3 is a block diagram showing a plurality of directional couplers in a "daisy chain" configuration according to one or more embodiments.

As discussed above, in certain applications and embodiments, such as in a multimode, multiband (MMMB) front end module, it may be desirable to use a single directional coupler over multiple operating frequency bands. Further, in certain embodiments a multimode, multiband front end module may include two or more directional couplers connected together in a "daisy chain" configuration, as shown in FIG. 3, for example. The example illustrated in FIG. 3 includes a high-band coupler 310 connected to a low-band coupler 320 in a daisy chain configuration. Such configurations may necessitate couplers with high directivity as well as substantially similar coupling factors across different frequency bands. As shown in FIG. 3, the high-band coupler 310 includes a high-band input port 312, a high-band transmitted port 314, a high-band coupled port 316, and a high-band isolation port 318. Similarly, the low-band coupler 320 includes a low-band input port 322, a low-band transmitted port 324, a low-band coupled port 326, and a low-band isolation port 328. In a daisy chain configuration, the isolation port of one directional coupler may be electrically connected to the coupled port of the next directional coupler in the chain. Thus, as shown in FIG. 3, the isolation port 318 of the high-band coupler 310 is connected to the coupled port 326 of the low-band coupler 320, such that the two couplers share a common termination impedance 330 connected to the isolation port 328 of the low-band coupler 320. Although only two directional couplers are illustrated in FIG. 3, principles disclosed herein may be utilized in configurations comprising any number of couplers, such as three or more. In addition, although one high-band coupler 310 and one low-band coupler 320 are shown in FIG. 3, other embodiments may include one or more couplers configured for operation in any frequency band.

As discussed above, in applications where a single directional coupler must operate over multiple frequency bands, or in configurations such as the daisy-chain shown in FIG. 3 where the termination impedance 330 is shared by multiple couplers operating at different frequency bands, a fixed real 50 Ohm or 75 Ohm load may not allow for sufficiently high coupler performance over all the operating frequency bands. Accordingly, to address the inadequacy of a real 50 or 75-Ohm termination impedance, aspects and embodiments provide a tuned complex termination circuit that may be used to improve coupler performance. In certain embodiments, the termination circuits disclosed herein may be used to provide the shared termination impedance 330 for a plurality of daisy-chained couplers. As discussed above, proper coupler termination $\Gamma_{CT}$ can reduce power variation caused by non-ideal S22 and coupler directivity. In certain embodiments, a complex load at the isolation port 208 of a directional coupler is used to compensate for non-ideal factors in power amplifier front end modules.

According to one embodiment, a coupler termination circuit may include one or more passive devices, such as capacitors and/or inductors, which may provide passive frequency-selective impedance based on the frequency-dependent impedances presented by such devices. For example, referring to FIG. 4A, there is illustrated one example of a coupler termination circuit 400 that can be used as the termination load 330 connected to the isolation port 328 of a daisy-chained coupler system to provide reduced coupler error for multiple operating frequency bands. In the example shown in FIG. 4A, the coupler termination circuit 400 includes a capacitance 402, a resistance 404, and an inductance 406 connected in parallel with one another to form a parallel RLC circuit 408. Each of the capacitance 402, the resistance 404, and the inductance 406 may include one or more discrete passive devices. The coupler termination circuit 400 further includes a series inductance 410 and a series capacitance 412 connected in series with the parallel RLC circuit 408. Each of the series inductance 410 and the series capacitance 412 may similarly include one or more discrete passive devices. As the inductances 406 and 410 and the capacitances 402 and 412 have frequency-varying impedances, the impedance of the coupler termination circuit 400 may vary for signals of different frequencies. Therefore, as discussed further below, the values of the capacitances 402 and 412, the resistance 404, and/or the inductances 406 and 410 may be selected to achieve the desired complex impedance for the frequency bands of interest. In certain embodiments, the capacitance 402 is configured to resonate with the inductance 406 at certain frequencies of interest to provide the desired impedance.

Figure 4A:
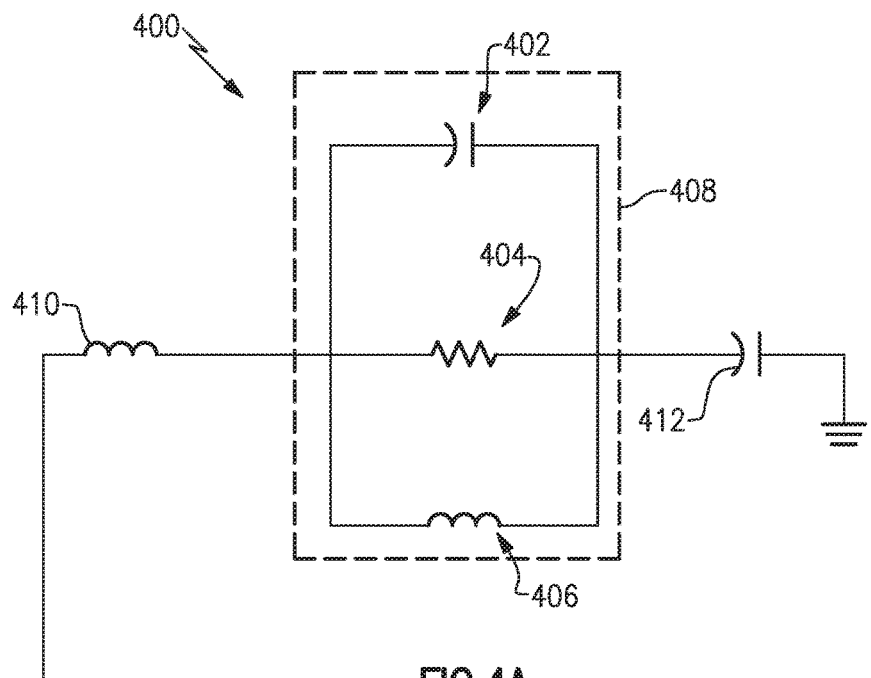
FIG. 4A is a diagram of one example of an adaptive complex coupler termination circuit according to one or more embodiments.
Figure 4B:
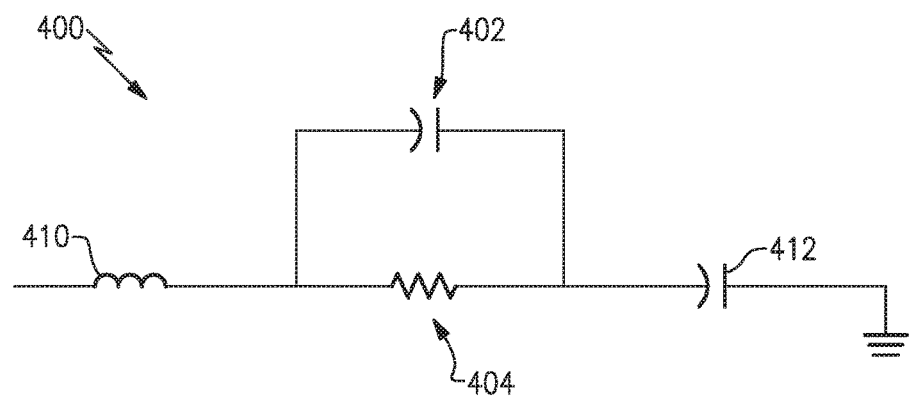
FIG. 4B is a diagram of another example of an adaptive complex coupler termination circuit according to one or more embodiments.

FIG. 4B illustrates another example of the coupler termination circuit 400. In this example, the coupler termination circuit 400 includes the series inductance 410 connected in series with the resistance 404 and the series capacitance 412, and the capacitance 402 connected in parallel with the resistance 404. Again, any of the components may include one or more discrete passive devices. Further, in other examples, the capacitance 402 connected in parallel with the resistance 404 may be replaced with the inductance 406.

In the examples shown in FIGS. 4A and 4B, the coupler termination circuit 400 includes only passive devices (inductors, resistors, and capacitors); however, in other examples the coupler termination circuit may include switch network for actively selecting components having different impedances for different operating frequency bands.

The following process may be used to tune the complex coupler termination circuit 400 for a daisy-chain coupler configuration such as shown in FIG. 3. The following example includes one 800 MHz band (low-band) coupler and one 1.98 GHz band (high-band) coupler; however, those skilled in the art will appreciate, given the benefit of this disclosure, that the process may be adapted for any operating frequency bands (not limited to 800 MHz and 1.98 GHz) and to three or more operating frequency bands.

Figure 5:
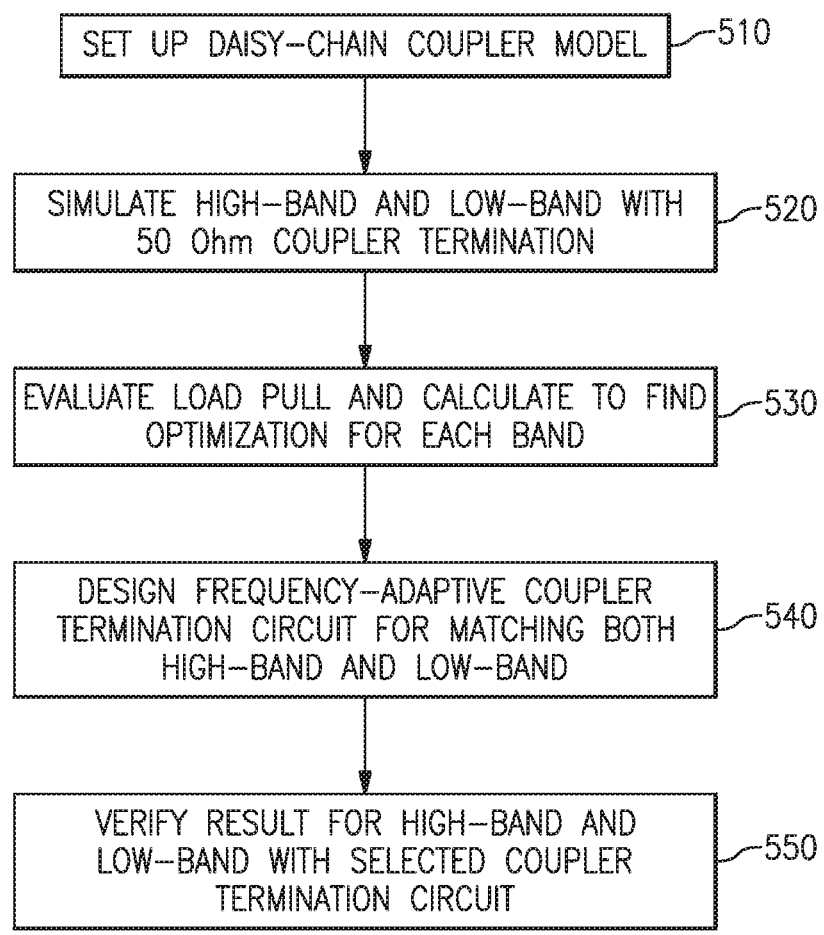
FIG. 5 is a flow diagram of one example of a method of tuning a complex coupler termination circuit 400 for a daisy-chain coupler configuration according to one or more embodiments.
Figure 6:
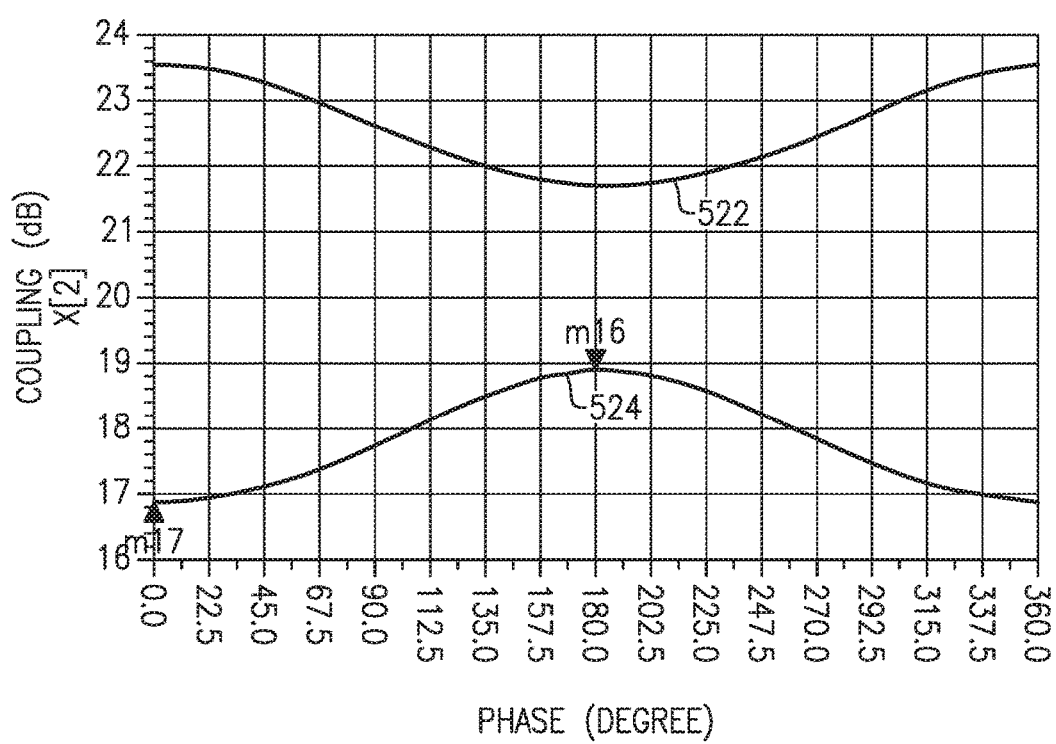
FIG. 6 is a graph showing an example of simulated coupler error for an example of the daisy-chain coupler configuration shown in FIG. 3 with a standard 50 Ohm termination load.

Referring to FIG. 5, a first step 510 may include creating a lump coupler model for the daisy-chain coupler system in which the coupler termination circuit 400 is to be used. A next step 520 may include using the model to simulate high-band and low-band performance of the daisy-chain coupler with a standard 50 Ohm (or other valued) termination impedance connected to the isolation port 328. FIG. 6 is a graph showing simulated coupler error for this example with a standard 50 Ohm load connected at the isolation port 328. In FIG. 6, curve 522 represents the low-band (LB) coupler error, and curve 524 represents the high-band (HB) coupler error. The simulation shows a high-band coupler error of 2.008 dB at 1.98 GHz, and a low-band coupler error of 1.86 dB at 800 MHz.

Figure 7:
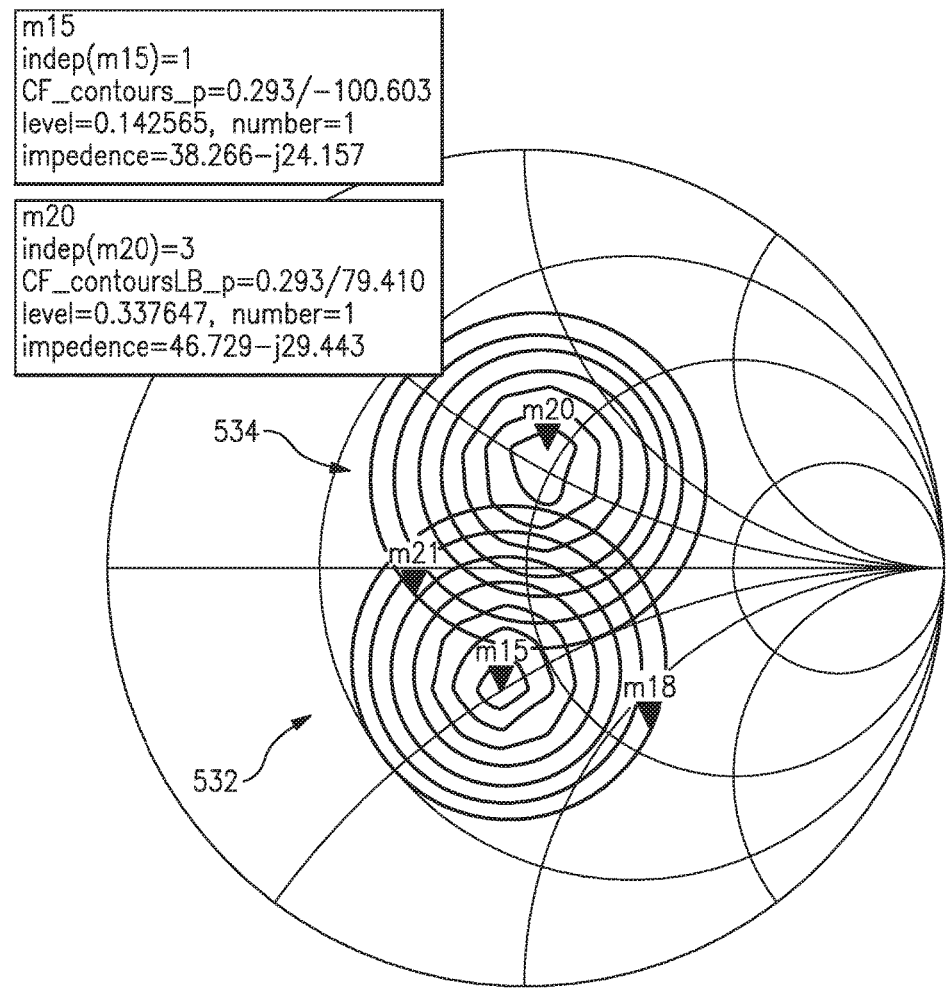
FIG. 7 is a smith chart illustrating an example of simulated coupler error load-pull results for the example of the daisy-chain coupler configuration according to one or more embodiments.

Referring again to FIG. 5, the simulated load pull results may be used to find the optimized load for each band (step 530). FIG. 7 is a smith chart illustrating an example of simulated coupler error load-pull results for this example. The graph of FIG. 7 may correspond to a VSWR value of approximately 2.5 at the transmitted ports 314, 324. The graph provides the coupler error contour at the plane of the coupler isolation port 328. A lower contour 532 illustrates a coupler error contour for low-band performance. The graph shows a best optimized error of approximately 0.34 dB for low-band performance at the complex impedance identified by reference m15. An upper contour 534 illustrates a coupler error contour for high-band performance. The graph shows a best optimized error of approximately 0.14 dB for high-band performance at the complex impedance identified by reference m20.

Figure 8:
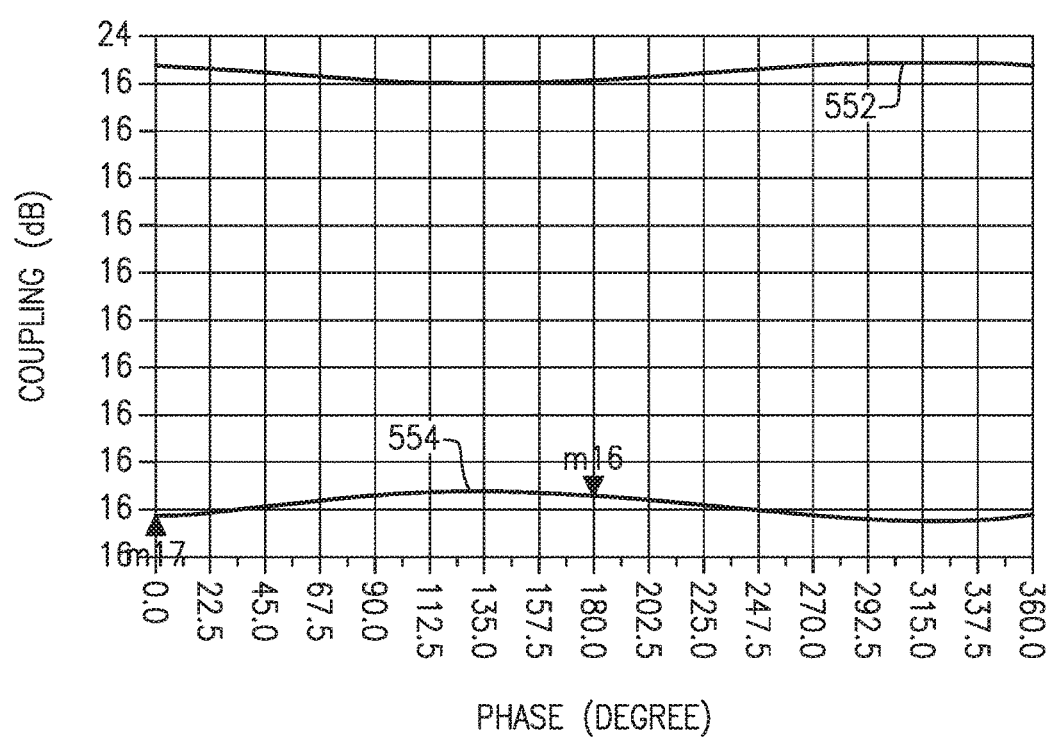
FIG. 8 is a graph showing an example of simulated coupler error for the daisy-chain coupler with a tuned complex coupler termination circuit connected as the termination load according to one or more embodiments.

Referring again to FIG. 5, in step 540 using the simulation results, an adaptive load, such as a certain configuration of the coupler termination circuit 400, may be constructed to match optimized performance results for both the high band and the low band. As discussed above, because the coupler termination circuit 400 includes reactive components with frequency-dependent impedance characteristics, the overall impedance provided by the coupler termination circuit 400 is self-adjusting as the frequency of the input signal changes (e.g., from a high-band signal to a low-band signal or vice-versa), thereby maintaining performance of the couplers at the different frequency bands. Thus, by appropriately selecting the components of the coupler termination circuit 400, this adaptive load can be tuned/configured to provide optimized combined performance for the daisy-chain coupler system as a whole over the multiple frequency bands supported by each coupler in the daisy-chain. Once the adaptive complex load has been applied to the system, results may be verified (step 550) to confirm improved performance relative to the 50-Ohm performance results obtained in step 520. FIG. 8 is a graph showing simulated coupler error for this example with a tuned complex termination circuit 400 having the configuration shown in FIG. 4A connected at the isolation port 328. In FIG. 8, curve 552 represents the low-band coupler error, and curve 554 represents the high-band coupler error. For this simulation, the components of the coupler termination circuit 400 had the following values: series inductance 410=3.3 nH; capacitance 402=1.55 pF; resistance 404=80 Ohm; inductance 406=27.3 nH; and series capacitance 412=20 pF. The simulation shows a high-band coupler error of 0.29 dB at 1.98 GHz, and a low-band coupler error of 0.21 dB at 800 MHz. Thus, the tuned coupler termination circuit 400 provides significantly improved coupler error compared to having the standard 50 Ohm load connected at the isolation port 328. The single tuned coupler termination circuit 400 may thus improve or optimize the combined performance of the daisy-chain coupler system 300 over both the low-band and the high-band.

Thus, aspects and embodiments may provide a coupler termination circuit 400 that can be used to provide a shared termination impedance for multiple directional couplers connected in a daisy-chained configuration as shown in FIG. 3, and can be configured to optimize the combined performance of the multiple directional couplers (e.g., the high-band coupler 310 and low-band coupler 320) over corresponding multiple frequency bands. In addition, as discussed above, because the tuned coupler termination circuit 400 includes reactive components, the tuned coupler termination circuit 400 is self-adjusting with changing frequency, and therefore may provide a highly adaptable termination load that can improve coupler performance over multiple operating frequency bands as compared to a daisy-chained coupler system terminated with a standard real load.

The various embodiments disclosed herein provide solutions for developing wide band termination for directional couplers in RF front end modules to adaptively match multiple operational bands. Solutions disclosed herein may provide improved coupler error performance for each of multiple bands in a multimode, multiband front end module, for example. In certain embodiments, improvement for at least one of low-band and high-band performance may be achieved in the range+/−0.6 dB.

Figure 9:
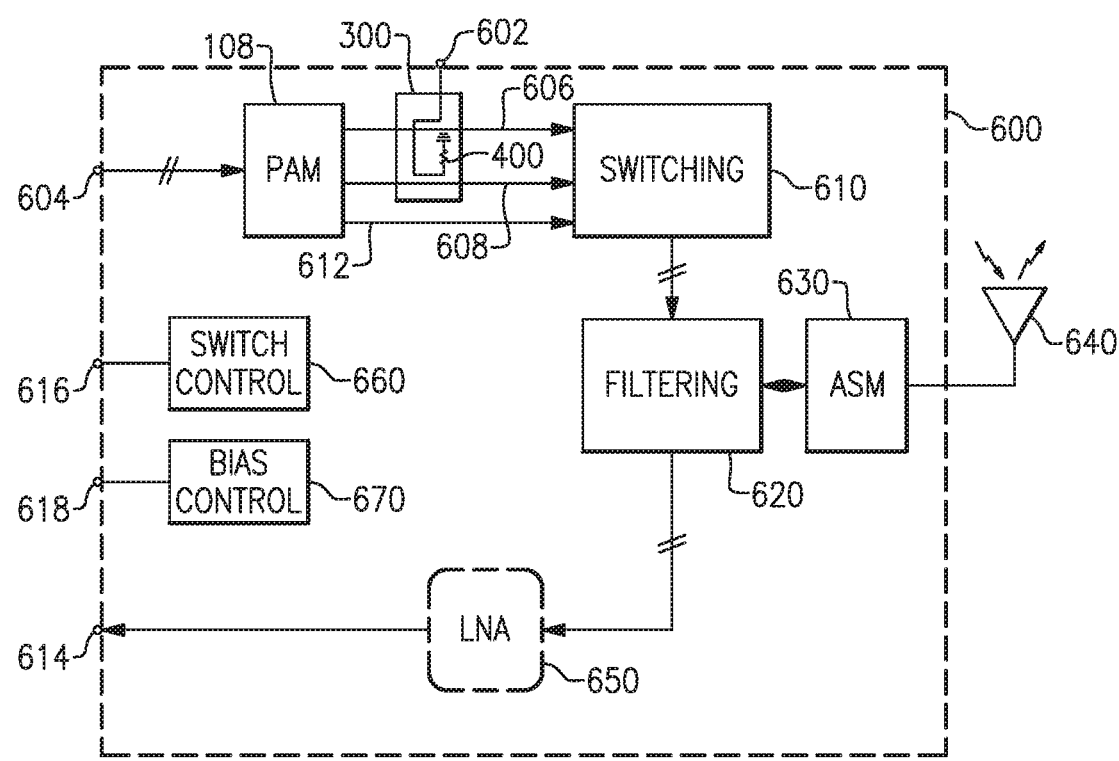
FIG. 9 is a block diagram of one example of a front end module incorporating a directional coupler according to one or more embodiments.

As discussed above, a daisy-chain coupler module including two or couplers daisy-chained together, such as shown in FIG. 3, can be included in a multimode, multiband front end module. FIG. 9 is a block diagram showing one example of a multimode, multiband front end module 600 including a coupler module 300. In this example, the coupler module 300 includes a first coupler (e.g., a high-band coupler) and a second coupler (e.g. a low-band coupler) daisy-chained together as shown in FIG. 3. The coupled port 316 is connected to a coupler output terminal 602 such that the coupled signals can be provided to another component (e.g., a detector, as discussed above). The multimode, multiband front end module 600 may include circuitry for accommodating any desirable number of operational bands, as discussed above. RF input signals for transmission are provided to a power amplifier module 108 via one or more input terminals 604. The RF input signals are amplified by the power amplifier module 108 and provided to switching circuitry 610. The coupler module 300 may be used to couple signal power from one or more of the RF input signals and provide the coupled signal(s) at the coupler output terminal 602. As discussed above, in the illustrated example, the coupler module 300 includes a first coupler associated with one transmission line 606 (e.g., for a high-band RF signal) and a second coupler associated with another transmission line 608 (e.g., for a low-band RF signal). The power amplifier module 108 may provide other RF input signals to the switching circuitry 610, bypassing the coupler module 300, as indicated by transmission line 612. As discussed above, in other examples, the coupler module 300 may include additional daisy-chained couplers, all sharing the common adaptive complex coupler termination circuit 400.

Still referring to FIG. 9, the switching circuitry 610 may include a plurality of switches configured to direct one or more of the RF input signals from the outputs (transmitted ports) of the coupler module 300 or from the power amplifier module 108 to a filtering module 620. The filtering module 620 may include one or more high-pass, low-pass, or band-pass transmit filters, optionally arranged as one or more duplexers or diplexers, for filtering the RF input signals in different frequency bands and providing frequency selectivity. The RF input signals may be directed from the filtering module 620 via an antenna switch module 630 to an antenna 640 for transmission. In certain examples the antenna 640 may also receive RF signals in one or more frequency bands. Accordingly, the antenna switch module 630 may include one or more switches to configure the multimode, multiband front end module 600 between a transmit mode and a receive mode. In the transmit mode, the antenna switch module 630 may connect an output of one of the filters in the filtering circuitry 620 to the antenna 640 to allow transmission of the RF input signals in a particular frequency band. In the receive mode, the antenna switch module 630 may connect the antenna 640 to a receive filter in the filtering module 620. Thus, the antenna switch module 630 can facilitate, for example, multiband multimode operation of the multimode, multiband front end module 600. The received RF signals, in a particular frequency band at a given time, may be provided at one or more RF output terminals 614. Optionally the multimode, multiband front end module 600 can include a low noise amplifier (LNA) module 650 in the receive path. The low noise amplifier module 650 can include one or more amplifiers configured to amplify the received RF signals.

The multimode, multiband front end module 600 may further include switch control circuitry 660 configured to actuate switches in the switching circuitry 610 and antenna switch module 630 to appropriately provide RF input signals in a selected transmit frequency band to the antenna 640 and allow received RF signals in a selected receive frequency band to be output at the RF output terminal(s) 614. The switch control circuitry 660 may receive control signals from an external component via one or more switch control terminals 616. The multimode multiband front end module 600 may further include bias control circuitry 670 configured to appropriate bias the one or more power amplifiers included in the power amplifier module 108. In examples in which the multimode, multiband front end module 600 includes the low noise amplifier module 650, the bias control circuitry 670 may be further configured to appropriately bias the one or more amplifiers included in the low noise amplifier module. The bias control circuitry 670 may receive control signals from an external component via one or more bias control terminals 618.

While various embodiments of multimode multiband front-end modules have been described, it will be apparent to those of ordinary skill in the art that many more embodiments and implementations are possible. For example, embodiments of integrated front end modules are applicable to different types of wireless communication devices, incorporating various front end module components. In addition, embodiments of front end modules are applicable to systems where compact, high-performance design is desired. Some of the embodiments described herein can be utilized in connection with wireless devices such as mobile phones. However, one or more features described herein can be used for any other systems or apparatus that utilize of RF signals.

As discussed above, in some implementations, a coupler module 300, or multimode, multiband front end module 600 incorporating a coupler module 300, having one or more features described herein can be included in an RF device such as a wireless device. The coupler module 300 or multimode, multiband front end module 600 can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Figure 10:
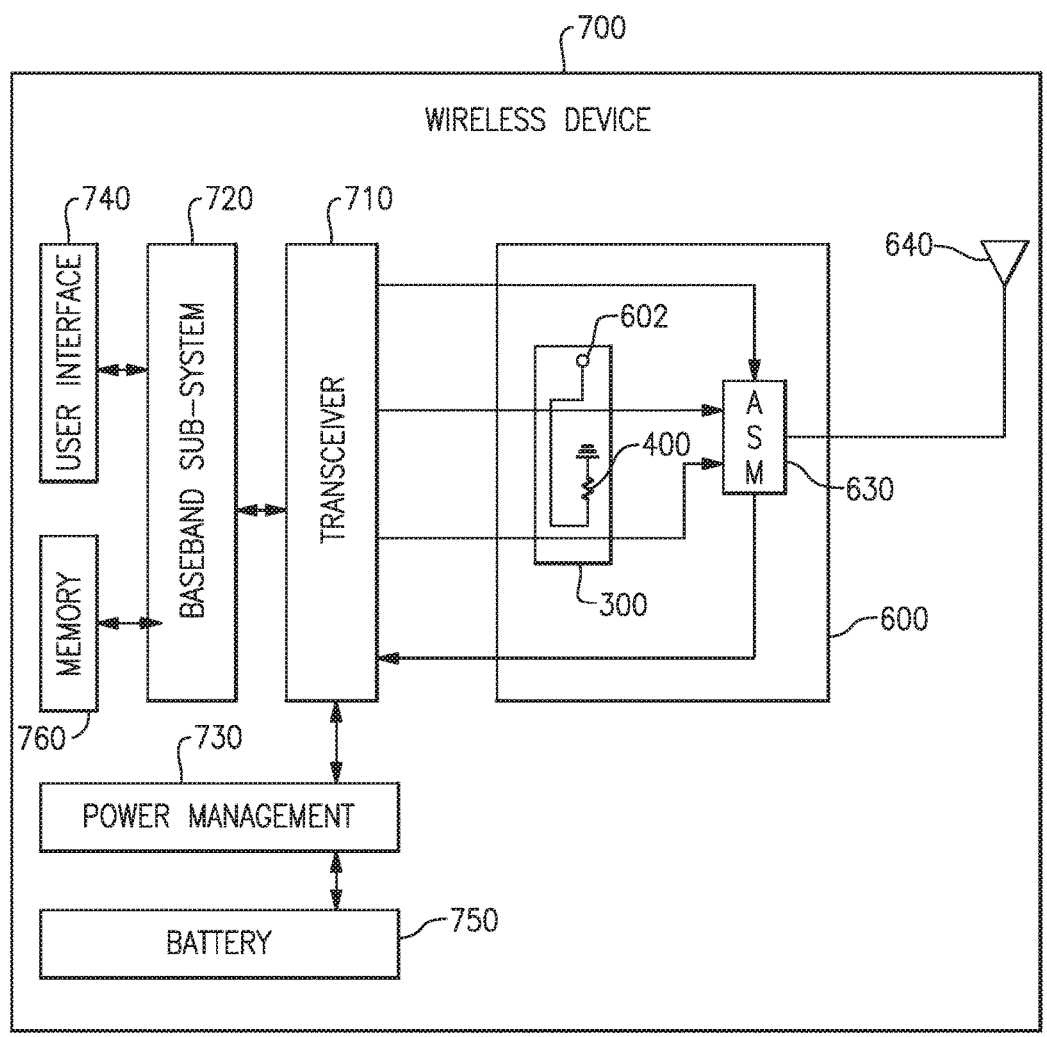
FIG. 10 is block diagram of one example of a wireless device incorporating the front end module of FIG. 9 according to one or more embodiments.

FIG. 10 is a block diagram illustrating an example wireless device 700 having one or more advantageous features described herein. The wireless device 700 includes an example of the multimode multiband front end module 600. For simplicity, not all of the components of the multimode, multiband front end module 600 are shown in FIG. 10. As discussed above, the multimode multiband front end module 600 includes the coupler module 300 having the adaptive complex coupler termination circuit 400. As such, the multimode, multiband front end module 600, and therefore the wireless device 700 in which it is used, can provide the coupler module having improved performance and reduced coupler error over a wide frequency range or multiple transmit frequency bands because the complex coupler termination circuit 400 can be designed to provide improved or optimal combined performance over the multiple transmit frequency bands and is self-adjusting to maintain performance over changing frequencies due to the inclusion of one or more reactive components, as discussed above.

As shown in FIG. 10, the multimode, multiband front end module may receive RF input signals from a transceiver 710 that can be configured and operated in known manners. The transceiver 710 can also be configured to process received signals. The transceiver 710 is shown to interact with a baseband sub-system 720 that is configured to provide conversion between data and/or voice signals suitable for a user and RF signals suitable for the transceiver 710. The transceiver 710 is also shown to be connected to a power management component 730 that is configured to manage power for the operation of the wireless device 700. Such a power management component 730 can also control operations of the baseband sub-system 720. The power management component 730 may be connected to a power source, such as a battery 750, for example.

Still referring to FIG. 10, the baseband sub-system 720 is shown to be connected to a user interface 740 to facilitate various input and output of voice and/or data provided to and received from the user. The baseband sub-system 720 can also be connected to a memory 760 that is configured to store data and/or instructions to facilitate the operation of the wireless device 700, and/or to provide storage of information for the user.

A number of other wireless device configurations can utilize one or more features described herein. For example, a wireless device may not necessarily be a multiband device. In another example, a wireless device can include additional antennas such as diversity antenna, and additional connectivity features such as Wi-Fi, Bluetooth, and GPS.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings provided herein can be applied to other systems, not necessarily the wireless device 700 or multimode, multiband front end module 600 described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A daisy-chain directional coupler system comprising:
a first directional coupler including a first input port configured to receive a first radio-frequency (RF) signal within a first frequency band, a first output port, a first coupled port, and a first isolated port;
a second directional coupler including a second input port configured to receive a second RF signal within a second frequency band different from the first frequency band, a second output port, a second coupled port connected to the first isolated port, and a second isolated port; and
a termination circuit connected to the second isolated port and configured to provide a shared termination impedance for the first and second directional couplers selected to optimize combined performance of the first and second directional couplers over the first and second frequency bands, the termination circuit including a first inductor, a first capacitor, and a resistor connected in parallel to form a parallel RLC circuit, and the termination circuit further including a second inductor and a second capacitor, the parallel RLC circuit being connected in series with and between the second inductor and the second capacitor, the shared termination impedance being a complex impedance.

2. A radio-frequency (RF) system comprising:
a first directional coupler having a first input port, a first output port, a first coupled port, and a first isolated poet, the first directional coupler configured to receive a first RF signal within a first frequency band at the first input port and to provide the first RF signal on the first output port;
a second directional coupler having a second input port, a second output port, a second coupled port, and a second isolated port, the second directional coupler configured to receive a second RF signal at the second input port and to provide the second RF signal at the second output port, the second RF signal being within a second frequency band different from the first frequency band, the second coupled port being connected to the first isolated port;
a power amplifier module connected to the first input port of the first directional coupler and to the second input port of the second directional coupler and configured to provide the first and second RF signals;
power detection circuitry connected to the first coupled port of the first directional coupler; and
a termination circuit connected to the second isolated port of the second directional coupler and configured to provide a shared termination impedance for the first and second directional couplers selected to optimize combined performance of the first and second directional couplers over the first and second frequency bands, the termination circuit including a first inductor, a first capacitor, and a resistor connected in parallel to form a parallel RLC circuit, and the termination circuit further including a second inductor and a second capacitor, the parallel RLC circuit being connected in series with and between the second inductor and the second capacitor, the shared termination impedance being a complex impedance.

3. A wireless device comprising:
a transceiver configured to process a plurality of RF signals in a corresponding plurality of frequency bands;
an antenna in communication with the transceiver configured to transmit the plurality of RF signals;
a plurality of directional couplers each having an input port configured to receive one of the RF signals in a respective one of the plurality of frequency bands and an output port configured to provide the one of the RF signals to the antenna, the plurality of directional couplers each further including a main transmission line extending between the input port and the output port and a coupled transmission line, the coupled transmission lines of the plurality of directional couplers being connected together in series to provide a daisy-chain of the plurality of directional couplers;
a power amplifier module connected to the input port of each directional coupler in the daisy-chain and configured to provide the plurality of RF signals;
power detection circuitry connected to a coupled port of a first directional coupler in the daisy-chain; and
a termination circuit connected to an isolated port of a last directional coupler in the daisy-chain and configured to provide a shared termination impedance for the plurality of directional couplers that is selected to optimize combined performance of the plurality of directional couplers over the plurality of frequency bands, the termination circuit including a first inductor, a first capacitor, and a resistor connected in parallel to form a parallel RLC circuit, and the termination circuit further including a second inductor and a second capacitor, the parallel RLC circuit being connected in series with and between the second inductor and the second capacitor.

4. The directional coupler of claim 1 wherein a coupler error in at least one of the first frequency band and the second frequency band is 0.3 dB or less.

5. The directional coupler of claim 1 wherein a coupler error in each of the first frequency band and the second frequency band is 0.3 dB or less.

6. The directional coupler of claim 1 wherein the first frequency band includes a frequency of 800 MHz.

7. The directional coupler of claim 1 wherein the first frequency band includes a frequency of 1.98 GHz.

8. The directional coupler of claim 1 further comprising a third directional coupler including a third input port configured to receive a third RF signal within a third frequency band different from the first and second frequency bands, a third output port, a third coupled port, and a third isolated port connected to the first coupled port.

9. The radio-frequency system of claim 2 wherein a coupler error in at least one of the first frequency band and the second frequency band is 0.3 dB or less.

10. The radio-frequency system of claim 2 wherein a coupler error in each of the first frequency band and the second frequency band is 0.3 dB or less.

11. The radio-frequency system of claim 2 wherein the first frequency band includes a frequency of 800 MHz.

12. The radio-frequency system of claim 2 wherein the first frequency band includes a frequency of 1.98 GHz.

13. The radio-frequency system of claim 2 further comprising an antenna switch module coupled to the first output port and the second output port and configured to provide an antenna output port.

14. The wireless device of claim 3 wherein a coupler error in at least one of the plurality of frequency bands is 0.3 dB or less.

15. The wireless device of claim 3 wherein a coupler error in each of the plurality frequency bands is 0.3 dB or less.

16. The wireless device of claim 3 wherein at least one of the plurality of frequency bands includes a frequency of 800 MHz.

17. The wireless device of claim 3 wherein at least one of the plurality of frequency bands includes a frequency of 1.98 GHz.

18. The wireless device of claim 3 further comprising an antenna switch having a plurality of inputs each coupled to the output port of a corresponding one of the plurality of directional couplers and a switch output coupled to the antenna.

19. The wireless device of claim 3 further comprising at least one of a memory, a baseband sub-system, a user interface, and a battery.

* * * * *

UNITED STATES PATENT AND TRADEMARK OFFICE
CERTIFICATE OF CORRECTION

| | |
|---|---|
| PATENT NO. | : 9,755,670 B2 |
| APPLICATION NO. | : 15/358233 |
| DATED | : September 5, 2017 |
| INVENTOR(S) | : David Ruimin Chen et al. |

It is certified that error appears in the above-identified patent and that said Letters Patent is hereby corrected as shown below:

In the Claims

Column 15, Line 63, Claim 2, delete "poet" and insert -- port --.

Signed and Sealed this
Tenth Day of October, 2017

Joseph Matal
*Performing the Functions and Duties of the*
*Under Secretary of Commerce for Intellectual Property and*
*Director of the United States Patent and Trademark Office*